(12) United States Patent
Egli et al.

(10) Patent No.: US 6,773,568 B2
(45) Date of Patent: Aug. 10, 2004

(54) METAL ALLOY COMPOSITIONS AND PLATING METHODS RELATED THERETO

(75) Inventors: Andre Egli, Staefa (CH); Anja Vinckier, Vlezenbeek (BE); Jochen Heber, Kriens (CH); Wan Zhang, Luzern (CH)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/620,957

(22) Filed: Jul. 16, 2003

(65) Prior Publication Data

US 2004/0086697 A1 May 6, 2004

Related U.S. Application Data

(62) Division of application No. 09/895,470, filed on Jun. 29, 2001, now Pat. No. 6,706,418.
(60) Provisional application No. 60/215,664, filed on Jul. 1, 2000.

(51) Int. Cl.$^7$ .............................. C25D 5/02; C25D 3/60
(52) U.S. Cl. ..................... 205/80; 205/122; 205/123; 205/125; 205/148; 205/241; 205/244; 205/253; 205/255; 205/263; 205/266; 205/271; 205/291; 205/300; 205/302; 205/303; 205/304; 205/305; 205/315
(58) Field of Search ................... 205/80, 122, 123, 205/125, 148, 241, 244, 253, 255, 263, 266, 271, 291, 300, 302, 303, 304, 305, 315

(56) References Cited

U.S. PATENT DOCUMENTS

| | | |
|---|---|---|
| 2,109,887 A | 3/1938 | Mattacotti |
| 3,429,790 A | 2/1969 | Schoot et al. |
| 3,769,179 A | 10/1973 | Durose et al. |
| 4,242,182 A | 12/1980 | Popescu et al. |
| 4,830,903 A | 5/1989 | Levy |
| 6,267,863 B1 | 7/2001 | Abys et al. |

FOREIGN PATENT DOCUMENTS

| | | |
|---|---|---|
| DE | 25 10 870 | 9/1975 |
| EP | 0 362 981 A | 4/1990 |
| GB | 1 304 844 A | 1/1973 |

OTHER PUBLICATIONS

Database WPI, Section Ch, Week 199954, Derwent Publication Ltd., London, GB; AN 1999–632015, XP002178905 & RU 2 113 555 C (Univ. Mendeleev Chem. Techn), Jun. 20, 1998 *abstract*.
Database WPI, Section Ch, Week 198125, Derwent Publications Ltd., London, GB; AN 1981–45667D, XP002178906 & SU 768 859 A (As Lith. Chem. Tech.), Oct. 7, 1980 *abstract*.
Database WPI, Section Ch, Week 198604, Derwent Publications Ltd., London, GB: AN 1986–024460, XP002178907 & JP 60 245797 A (Nippon Steel Corp), Dec. 5, 1985 *abstract*.
Database WPI, Section Ch, Week 197650, Derwent Publications Ltd., London GB; AN 1976–93318X, XP 002178908 & JP 51 123731A (Nihon Kagaku Sangyo), Oct. 28, 1976, *abstract*.
Patent Abstracts of Japan, vol. 013, No. 419 (C–637), Sep. 18, 1989 & JP 01 156490 A (Nippon Engeruharudo KK), Jun. 20, 1989, *abstract*.

*Primary Examiner*—Robert R. Koehler
(74) *Attorney, Agent, or Firm*—John J. Piskorski

(57) ABSTRACT

The present invention provides inter alia electroplating compositions, methods for use of the compositions and products formed by the compositions. Electroplating compositions of the invention are characterized in significant part by a grain refiner/stabilizer additive comprising one or more non-aromatic compounds having π electrons that can be delocalized, e.g., an α,β unsaturated system or other conjugated system that contains a proximate electron-withdrawing group. Compositions of the invention provide enhanced grain refinement and increased stability in metal plating solutions, particularly in tin and tin alloy plating formulations.

14 Claims, No Drawings

METAL ALLOY COMPOSITIONS AND PLATING METHODS RELATED THERETO

This application is a divisional of application Ser. No. 09/895,470 filed on Jun. 29, 2001, now U.S. Pat. No. 6,706,418. The nonprovisional application designated above, namely application Ser. No. 09/895,470, filed Jun. 29, 2001, claims the benefit of U.S. Provisional Application 60/215,664, filed Jul. 1, 2000.

BACKGROUND OF THE INVENTION

1. Field of the Invention

This invention relates generally to the field of metal alloys useful for metal plating a wide variety of articles, including printed circuit boards and other electronic packaging devices. In particular, the invention relates to additives and their use as a grain refiner in tin and tin alloy plating formulations. Furthermore, the present invention relates to additives which improve the stability of metal plating solutions, particularly copper-based systems.

2. Background

For many years, tin-lead alloy electroplating has been the process of choice in applications requiring attachment of electronic components to printed wiring boards by soldering or reflowing. Such tin-lead alloys have been used as solders and solderable finishes on components. The temperature at which the solder melts is highly important. For tin-lead alloys the temperature of 183° C. (eutectic Sn—Pb) matches very well the currently used materials for electronic parts. Much higher melting temperatures may result in deformations of the printed wiring board laminate, whereas distinctly reduced liquidus temperatures may lead to unwanted melting of the solder joint during other thermal operations of the assembly process.

Due to its toxic properties lead will likely be banned in electronic parts in the near future. Many tin-lead alternatives have been suggested, including pure tin, tin-silver, tin-copper, and tin-bismuth.

Electroplating articles with tin coatings is generally well known in the industry. Electroplating methods involve passing a current between two electrodes in a plating solution where one electrode is the article to be plated. A common plating solution would be an acid tin plating solution containing (1) a dissolved tin salt (such as tin alkylsulfonate), (2) an acidic electrolyte (such as alkylsulfonic acid) in an amount sufficient to impart conductivity to the bath and (3) additives (such as surfactants, brighteners, levelers and suppressants) to enhance the effectiveness and quality of plating. For example, U.S. Pat. No. 5,174,887 (Federman et al.) discloses a process for the high speed electroplating of tin having as a surfactant an alkylene oxide condensation product of an organic compound having at least one hydroxy group and 20 carbon atoms or less. The organic compounds include an aliphatic hydrocarbon of between 1 and 7 carbon atoms, an unsubstituted aromatic compound or an alkylated aromatic compound having 6 carbon atoms or less in the alkyl moiety.

It is also well known to electroplate articles with tin-alloys. For example, U.S. Pat. No. 6,176,996 (Moon) discloses certain tin-alloy electroplating baths containing a tin salt, a metal salt selected from zinc, cobalt, bismuth or copper salts, methanesulfonic acid, a conductive compound and a complexing agent.

A problem with tin electroplating baths is instability, i.e. sludge may form in the bath with time. Such sludge results from oxidation and subsequent precipitation of the metals in the bath. A number of additives have been proposed to prevent or reduce such sludge formation, however such additives adversely affect certain characteristics of the metal deposit, such as grain refinement.

It thus would be desirable to have new electroplating compositions. It would be particularly desirable to have new electroplating compositions that have increased stability, i.e. prevent or reduce sludge formation. It also would be particularly desirable to have new electroplating compositions which exhibit improved grain refinement.

SUMMARY OF THE INVENTION

We have now found new electroplating compositions that effectively plate a wide variety of articles, including printed circuit boards and other electronic packaging devices. Electroplating compositions of the invention exhibit enhanced grain refinement and stability. Using compositions of the invention, precipitation of metals from the plating solutions is eliminated or at least significantly reduced.

Compositions and methods of the invention are particularly useful for depositing solderable finishes on electronic components such as printed wiring boards, semiconductor packaging, lead frames and connectors, and for depositing solder bumps such as those used on integrated circuits. The present compositions also may be used in a wide variety of other electronic device applications, such as in the manufacture of integrated circuits, optoelectronic devices and the like.

Electroplating compositions of the invention are characterized in significant part by an additive that dually functions as a grain refiner and a stabilizer. Preferably, such additive comprises one or more non-aromatic compounds having π electrons that can be delocalized. Examples of such compounds include an α,β unsaturated system or other conjugated system that contains a proximate (e.g., within 1–2 carbons of a carbon-carbon double bond) electron-withdrawing group.

Cyclic systems that contain endocyclic conjugation are generally preferred. Particularly preferred are keto-enole systems. Even more preferred are cyclic keto-enole systems which contain a rigid arrangement of two oxygen donors, particularly where the enole functionality is endocylic.

Keto functionalities having a low $pK_a$ value also are particularly preferred systems for use as stabilizer additives in electroplating compositions of the invention.

Preferable concentrations for such present additive for use in electroplating compositions of the invention are between about 2 and about 10,000 mg per L, more preferably between about 50 and about 2000 mg per L, in acid plating solutions.

Preferably, the present additive concentration is maintained at such concentrations throughout the entire or at least substantial portion of a plating cycle. Such maintenance of the stabilizer additive concentrations entails regular addition of the stabilizer additive during a plating cycle as the stabilizer additive component is consumed. Additive concentrations and replenishment rates during a plating cycle can be readily determined by known methods, such as the CPVS method as disclosed in U.S. Pat. Nos. 5,252,196 and 5,223,118, both assigned to the Shipley Company, or by the cyclic voltammetric stripping (CVS) methods, or liquid chromatography.

In addition to such a grain refiner/stabilizer additive, the plating bath may optionally contain one or more reducing agents, grain refiners such as hydroxy aromatic compounds, wetting agents, brightening agents, compounds to extend the current density range, such as carboxylic acids, levelers and the like. Mixtures of additives may also be used in the present invention.

The invention also includes articles of manufacture, including electronic devices such as printed circuit boards, multi-chip modules, lead frames, connectors, semiconductor packaging, optoelectronic devices and the like that contain a deposit produced from a plating solution of the invention.

Other aspects of the invention are discussed infra.

DETAILED DESCRIPTION OF THE INVENTION

Electroplating compositions of the invention suitably contain a tin salt, an electrolyte preferably an acidic aqueous solution, and a stabilizer additive comprising one or more non-aromatic compounds having π electrons that can be delocalized. Compositions of the invention may optionally contain one or more reducing agents, grain refiners such as hydroxy aromatic compounds, wetting agents, brightening agents, compounds to extend the current density range, such as carboxylic acids, levelers and the like.

Compositions and methods of the invention are characterized in large part by the use of one or more stabilizer additives. Electroplating compositions of the invention comprising such stabilizer additives exhibit enhanced grain refinement and improved stability. Using compositions of the invention, precipitation of metals from the plating solutions is eliminated or at least significantly reduced.

Preferred stabilizer additives include those compounds having an α,β unsaturated system or other conjugated system that contains a proximate (e.g., within 1–2 carbons of a carbon-carbon double bond) electron-withdrawing group.

Cyclic systems that contain endocyclic conjugation are generally preferred. Particularly preferred are keto-enole systems. Even more preferred are cyclic keto-enole systems which contain a rigid arrangement of two oxygen donors, particularly where the enole functionality is endocyclic. See, e.g., representative formulae IA–IB below.

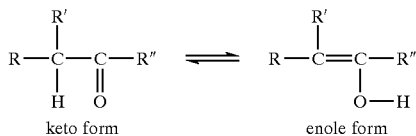

In simple cases (R"=H, alkyl, OR, and the like), and the equilibrium lies well to the left. The keto form differs from the enole form in possessing a C—H, a C—C, and a C=O bond where the enole has a C=C, a C—O, and an O—H bond. Further aspects of keto-enole tautomerism are presented in *Advanced Organic Chemistry*, J. March, 4<sup>th</sup> ed., John Wiley & Sons, 1992, note in particular pp. 70–74 and 585–587.

Particularly preferred keto-enole tautomers are shown below as represented by formulae IIA–IIC.

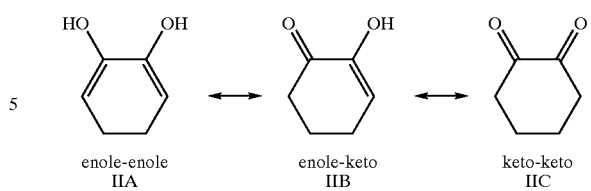

Keto functionalities having a low $pK_a$ also are particularly preferred systems for use as the present grain refiner/stabilizer additives in electroplating compositions of the invention. This is due to the applied pH in the plating solution, which is acidic for tin plating. Particularly preferred compounds that include this structural feature include hydroxylated gamma-pyrones, e.g., maltol, ethylmaltol, kojic acid, meconic acid; comenic acid, hydroxylated benzoquinones such as chloranilic acid, dihydroxy benzoquinone, hydroxylated naphtoles such as chromotropic acid, several anthraquinones hydroxylated pyridones, cyclopentandiones, hydroxy-furanones, hydroxy-pyrrolidones, cyclohexanediones, and the like.

We have observed enhanced grain refinement and polarization in the low current density range, particularly when using stabilizer additives such as maltol, ethylmaltol, 3-methyl-1,2-cyclopentanedione and 2,5-dimethyl-4-hydroxy-3-furanone. In addition, the gamma-pyrones appear to solubilize tin(IV) in tin and tin alloy plating baths, thereby preventing or reducing the amount of precipitation of tin (IV). In an alternate embodiment, the gamma-pyrones also stabilize electroless copper solutions against plating-out.

Preferable concentrations for grain refiner/stabilizer additives for use in electroplating compositions of the invention are between about 2 and about 10,000 mg per L, more preferably between about 50 and about 2000 mg per L, in acid plating solutions. However, good results have been achieved with even lower concentrations, e.g. copper electroless plating formulations having a stabilizer additive concentration of at least about 2 mg per L of the metallization solution.

Electroplating compositions and methods of the invention are particularly well suited for use with tin and tin-alloy plating baths including, but not limited to, tin-silver, and tin-copper baths. Electroplating compositions and methods of the invention also are well suited for use with zinc and zinc-alloy plating baths. However, such compositions also are generally applicable to systems containing other alloy materials such as bismuth, indium, antimony, and gold.

Electroplating baths containing the electroplating compositions of the present invention are typically prepared by adding to a vessel one or more acidic electrolytes, followed by one or more tin compounds and optionally one or more other alloy compounds, e.g., copper compound(s), silver compound(s) and the like, and then one or more other additives, including the present grain refiner/stabilizer additive. Other orders of addition of the components of the compositions of the present invention may be used. Once the bath is prepared, undesired material is removed, such as by filtration, and then water is added to adjust the final volume of the bath. The bath may be agitated by any known means, such as stirring, swirling or shaking, for increased plating speed.

As discussed above, electroplating solutions of the invention are particularly useful for depositing solderable finishes on electronic components such as printed wiring boards, optoelectronic devices, semiconductor packaging, microchip module packaging, components, contacts, chip capacitors, chip resistors, lead frames and connectors, and for depositing solder bumps such as those used on integrated circuits.

Any substrate that can be electrolytically plated with a metal is suitable for plating according to the present invention. Suitable substrates include, but are not limited to: copper, copper alloys, nickel, nickel alloys, nickel-iron containing materials, electronic components, plastics, and the like. Suitable plastics include plastic laminates, such as printing wiring boards, particularly copper clad printed wiring boards.

The present grain refiner/stabilizer additives are useful in a wide variety of electrolytic and electroless plating baths, and preferably electrolytic plating baths. Suitable plating baths are those containing one or more metals selected from tin, copper, nickel, silver and the like, and preferably tin.

The one or more tin compounds useful in the present invention are any solution soluble tin compound. Suitable tin compounds include, but are not limited to tin salts, such as tin halides; tin sulfates; tin alkane sulfonate such as tin methane sulfonate, tin ethanesulfonate and tin propanesulfonate; tin aryl sulfonate such as tin phenyl sulfonate and tin toluene sulfonate; tin alkanol sulfonate; and the like. When tin halide is used, it is preferred that the halide is chloride. It is preferred that the tin compound is tin sulfate, tin chloride, tin alkane sulfonate or tin aryl sulfonate, and more preferably tin sulfate or tin methane sulfonate. Suitable tin alkane sulfonates include tin methanesulfonate, tin ethanesulfonate and tin propanesulfonate. Suitable tin aryl sulfonates include tin phenylsulfonate and tin toluenesulfonate. The tin compounds useful in the present invention are generally commercially available from a variety of sources and may be used without further purification. Alternatively, the tin compounds useful in the present invention may be prepared by methods known in the literature.

The amount of tin compound useful in the electrolyte compositions of the present invention is any amount that provides a tin content typically in the range of 2 to 100 g/L, and preferably 10 to 70 g/L. When the compositions of the present invention are used in a low speed plating process, the amount of tin present in the electrolyte composition is typically in the range of 2 to 60 g/L, and preferably 5 to 20 g/L. When the compositions of the present invention are used in a high speed plating process, the amount of tin present in the electrolyte composition is typically in the range of 20 to 100 g/L, and preferably 40 to 70 g/L. When the compositions of the present invention are used in high speed tin plating of steel, the amount of tin is typically in the range of 5 to 50 g/L, and preferably 10 to 30 g/L. Mixtures of tin compounds may also be used advantageously in the present invention, provided that the total amount of tin is in the range of from 2 to 100 g/L.

Any acidic electrolyte that is solution soluble and does not otherwise adversely affect the electrolyte composition may be used advantageously in the present invention. Suitable acidic electrolytes include, but are not limited to alkane sulfonic acids, such as methanesulfonic acid, ethanesulfonic acid and propanesulfonic acid, aryl sulfonic acids such as phenylsulfonic acid or toluenesulfonic acid, sulfuric acid, sulfamic acid, hydrochloric acid, hydrobromic acid and fluoroboric acid. Mixtures of acidic electrolytes are particularly useful, such as, but not limited to, mixtures of alkane sulfonic acids and sulfuric acid. Thus, more than one acidic electrolyte may be used advantageously in the present invention. The acidic electrolytes useful in the present invention are generally commercially available and may be used without further purification. Alternatively, the acidic electrolytes may be prepared by methods known in the literature.

Typically, the amount of acidic electrolyte is in the range of 10 to 400 g/L, and preferably 100 to 250 g/L. When the compositions of the present invention are used in the high speed tin plating of steel, the acidic electrolyte is typically present in an amount in the range of 20 to 80 g/L, and preferably 30 to 60 g/L. It is preferred that when the tin compound is a halide that the acidic electrolyte is the corresponding acid. For example, when tin chloride is used in the present invention, it is preferred that the acidic electrolyte is hydrochloric acid.

One or more alloying metals may be added to the present electroplating baths. Suitable alloying metals for a tin electroplating bath include, but are not limited to, copper, silver, zinc, bismuth, indium, antimony and gold. Preferred alloying metals are copper and silver. Such alloying metals are typically in the form of any solution soluble compound.

Suitable metal compounds include, but are not limited to metal halides, metal acetates, metal fluoroborates, metal sulfate, metal alkane sulfonate, metal alkanol sulfonate, metal nitrates and the like. When copper halide is used, it is preferred that the halide is chloride. It is preferred that the metal compound is metal sulfate, metal alkane sulfonate or mixtures thereof, and more preferably copper sulfate, copper methane sulfonate, silver methane sulfonate or mixtures thereof. Mixtures of alloying metal compounds may be used advantageously in the present invention. Thus, binary, ternary and high metal alloys may be produced. The alloying metal compounds useful in the present invention are generally commercially available or may be prepared by methods known in the literature.

The amount of alloying metal compound useful in the electrolyte compositions of the present invention is any amount that provides a metal content typically in the range of 0.01 to 10 g/L, and preferably 0.1 to 3 g/L. For a tin-copper alloy electroplating bath, the amount of copper present is typically in the range of 0.01 to 5 g/L, and preferably 0.02 to 2 g/L. For a tin-copper alloy electroplating bath used in high speed plating process, the amount of copper is typically in the range of 0.5 to 10 g/L, and preferably 0.5 to 5 g/L.

Reducing agents may be added to the electrolyte composition of the present invention to assist in keeping the tin in a soluble, divalent state. Suitable reducing agents include, but are not limited to, hydroquinone and hydroxylated aromatic compounds, such as resorcinol, catechol, and the like. Such reducing agents are disclosed in U.S. Pat. No. 4,871,429, herein incorporated by reference to the extent it teaches the preparation and use of such compounds. The amount of such reducing agent is well known to those skilled in the art, but is typically in the range of from about 0.1 g/L to about 5 g/L.

Bright deposits may be obtained by adding brighteners (or brightening agents) to the electrolyte compositions of the present invention. Such brighteners are well known to those skilled in the art. Suitable brighteners include, but are not limited to aromatic aldehydes such as chlorobenzaldehyde, derivatives of aromatic aldehydes such as benzal acetone, and aliphatic aldehydes such as acetaldehyde or glutaraldehyde. Such brighteners are typically added to the compositions of the present invention to improve the appearance and reflectivity of the deposit. Typically, brighteners are used at an amount of 0.5 to 3 g/L, and preferably 1 to 2 g/L.

When used in the manufacture of integrated circuits, lower levels of brightening agents are typically used in the present electroplating baths. For example, such electroplating compositions of the invention preferably have a brightener agent concentration of at least about 1.5 mg per liter of plating solution (1.5 mg/L), compared to typical brightener concentrations ranging from about 0.05 to 1.0 mg/L in prior composition. More preferably, in such electroplating baths for the manufacture of integrated circuits, the brightener concentration is at least about 1.75 mg/L, and still more preferably, at least about 2, 2.5, 3, 3.5 or 4 mg/L.

A wide variety of brighteners, including known brightener agents, may be employed in the present electroplating compositions used in the manufacture of integrated circuits. Typical brighteners in such compositions contain one or more sulfur atoms, and typically without any nitrogen atoms and a molecular weight of about 1000 or less. Brightener compounds that have sulfide and/or sulfonic acid groups are generally preferred, particularly compounds that comprise a group of the formula R'—S—R—SO$_3$X, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (i.e. —S—R—SO$_3$X or substituent of a larger compound). Typically alkyl groups will have from one to about 16 carbons, more typically one to about 8 or 12 carbons. Heteroalkyl groups will have one or more hetero (N, O or S) atoms in the chain, and preferably have from 1 to about 16 carbons, more typically 1 to about 8 or 12 carbons. Carbocyclic aryl groups are typical aryl groups, such as phenyl and naphthyl. Heteroaromatic groups also will be suitable aryl groups, and typically contain 1 to about 3 N, 0 or S atoms and 1–3 separate or fused rings and include e.g. coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, benzothiazol, and the like. Heteroalicyclic groups typically will have 1 to 3 N, 0 or S atoms and from 1 to 3 separate or fused rings and include e.g. tetrahydrofuranyl, thienyl, tetrahydropyranyl, piperdinyl, morpholino, pyrrolindinyl, and the like. Substituents of substituted alkyl, heteroalkyl, aryl or heteroalicyclic groups include e.g. C$_{1-8}$ alkoxy; C$_{1-8}$ alkyl; halogen, particularly F, Cl and Br; cyano; nitro; and the like.

Preferably, the brightener concentration is maintained throughout the entire electroplating process, or throughout at least a substantial portion of the plating process, e.g. at least about 50, 60, 70, 80 or 90 percent of the duration of the plating process. As discussed above, since brightener levels are depleted as the electroplating progresses, the brightener component is preferably regularly replenished during plating to maintain a steady state brightener concentration.

In addition to the copper salts, electrolyte and brightener, plating baths of the invention optionally may contain a variety of other components, including organic additives such as suppressor agents, leveling agents and the like.

The tin electrolyte compositions may further include one or more suppressor compounds, such as, but not limited to, alkylene oxide compounds. The one or more alkylene oxide compounds useful in the present invention are any which yield deposits having good solderability, good matte or lustrous finish with satisfactory grain refinement, are stable in the acidic electroplating bath, electroplate at high speeds, are substantially low foaming, and provide a cloud point of the bath above about. 110° F. (43° to 44° C.) it is preferred that the alkylene oxide compounds provide no foam to the bath during the electroplating process. Suitable alkylene oxide compounds include, but are not limited to, ethylene oxide/propylene oxide ("EO/PO") copolymers, alkylene oxide condensation products of an organic compound having at least one hydroxy group and 20 carbon atoms or less, compounds prepared by adding oxypropylene to polyoxyethylene glycol, and the like. Typically, the EO/PO copolymers have an average molecular weight in the range of from about 500 to about 10,000, and preferably from about 1000 to about 5000. It is preferred that the alkylene oxide compound is an EO/PO copolymer.

Suitable alkylene oxide condensation products of an organic compound having at least one hydroxy group and 20 carbon atoms or less include those having an aliphatic hydrocarbon of from one to seven carbon atoms, an unsubstituted aromatic compound or an alkylated aromatic compound having about six carbon atoms or less in the alkyl moiety, such as those disclosed in U.S. Pat. No. 5,174,887, herein incorporated by reference to the extent it teaches the preparation and use of these compounds. The aliphatic alcohols may be saturated or unsaturated. Suitable aromatic compounds are those having up to two aromatic rings. The aromatic alcohols typically have up to 20 carbon atoms prior to derivatization with ethylene oxide ("EO"). Such aliphatic and aromatic alcohols may be further substituted, such as with sulfate or sulfonate groups. Such suitable alkylene oxide compounds include, but are not limited to: ethyloxylated polystyrenated phenol having 12 moles of EO, ethyloxylated butanol having 5 moles of EO, ethyloxylated butanol having 16 moles of EO, ethyloxylated butanol having 8 moles of EO, ethyloxylated octanol having 12 moles of EO, ethyloxylated beta-naphthol having 13 moles of EO, ethyloxylated bisphenol A having 10 moles of EO, ethyloxylated sulfated bisphenol A having 30 moles of EO and ethyloxylated bisphenol A having 8 moles of EO.

Typically, the one or more alkylene oxide compounds are present in the electrolyte compositions of the present invention in an amount of from 0.1 to 15 g/L, and preferably 0.5 to 10 g/L.

Additionally or alternately, the present compositions may include one or more polyalkylene glycols. Suitable polyalkylene glycols are any which are compatible with the electrolyte composition, yield deposits having good solderability, good matte or lustrous finish with satisfactory grain refinement, are stable in the acidic electroplating bath, electroplate at high speeds, are substantially low foaming, and provide a cloud point of the bath above about 110° F. (43° to 44° C.). Suitable polyalkylene glycols include, but are not limited to, polyethylene glycol and polypropylene glycol, and preferably polyethylene glycol. Such polyalkylene glycols are generally commercially available from a variety of sources and may be used without further purification.

Typically, the polyalkylene glycols useful in the present invention are those having an average molecular weight in the range of from about 200 to about 100,000, and preferably from about 900 to about 20,000. Such polyalkylene glycols are present in the electrolyte compositions of the present invention in an amount of from about 0.1 to about 15 g/L, preferably from about 0.25 to about 10 g/L, and more preferably from about 0.5. to about 8 g/L.

Other suitable suppressors include, but are not limited to, amines such as ethoxylated amines, polyoxyalkylene amines and alkanol amines; amides; alkylpolyether sulfonates; complexing surfactants such as alkoxylated diamines; and complexing agents for cupric or cuprous ions which include entprol, citric acid, edetic acid, tartaric acid, potassium sodium tartrate, acetonitrile, cupreine and pyridine. Typically, such other suppressors are used in the same amounts as those described above.

Particularly suitable surfactants for plating compositions of the invention are commercially available polyethylene glycol copolymers, including polyethylene glycol copolymers. Such polymers are available from e.g. BASF (sold by BASF under Tetronic and Pluronic tradenames), and copolymers from Chemax. A butylalcohol-ethylene oxide-propylene oxide copolymer having a $M_w$ of about 1800 from Chemax is particularly preferred.

It will be appreciated by those skilled in the art that carboxy aromatic compounds or other wetting agents may be added to the electrolyte compositions of the present invention to provide further grain refinement. Such carboxy aromatic compounds function as grain refiners and may be added to the electrolyte composition of the present invention to further improve deposit appearance and operating current density range. A wide variety of such carboxy aromatic compounds are well known to those skilled in the art, such as picolinic acid, nicotinic acid, and isonicotinic acid. Suitable other wetting agents include, but are not limited to: alkoxylates, such as the polyethoxylated amines JEFFAMINE T-403 or TRITON RW, or sulfated alkyl ethoxylates, such as TRITON QS-15, and gelatin or gelatin derivatives. The amounts of such grain refiners useful in the present invention are well known to those skilled in the art and typically are in the range of 0.01 to 20 g/L, preferably 0.5 to 8 g/L, and more preferably 1 to 5 g/L.

The present metal electroplating compositions are suitably used in a similar manner as prior metal electroplating baths, except that one or more of the present grain refiner/stabilizer additives are employed and preferably maintained at the noted concentration throughout a plating cycle. The electrolyte compositions of the present invention are useful in any plating method where a tin or tin-alloy deposit is desired. Suitable plating methods include, but are not limited to barrel plating, rack plating and high speed plating. A tin or tin alloy deposit may be plated on a substrate by the steps of contacting the substrate with the electrolyte composition described above and passing a current through the electrolyte to deposit the tin or tin-alloy on the substrate.

The electrolyte compositions of the present invention and plating baths prepared therefrom typically are acidic, i.e. having a pH of less than 7, typically less than 1. If a composition of a specific pH is desired, such as in the range of 2.5 to 4.5, then appropriate adjustment of the pH is necessary. Such pH adjustment may be made by any known methods, such as the addition of base or use of lesser amounts of acidic electrolyte. Such electrolyte compositions of the present invention having a pH of in the range of 2.5 to 4.5 are particularly suited for use in the plating of components containing pH-sensitive materials such as, for example, glass or ceramic capacitors and resistors.

Plating baths of the invention are preferably employed at or above room temperature, e.g. up to and somewhat above 25° C. Typical temperatures are in the range of, but not limited to, 60° to 150° F. (15° to 66° C.) or higher, and preferably 70° to 125° F. (21° to 52° C.), and more preferably 75° to 120° F. (23° to 49° C.). It will be appreciated by those skilled in the art that lower plating temperatures are typically used with low speed, or non-high speed, plating systems and/or the use of brighteners. It also will be appreciated by those skilled in the art that higher temperatures are used with high speed plating systems. The plating composition is preferably agitated during use such as by air sparger, work piece agitation, impingement or other suitable method. Plating is preferably conducted at a current ranging from 1 to 2000 ASF (0.1 to 200 ASD) depending upon the metal to be plated, the particular plating method used and the substrate characteristics. When a non-high speed electroplating process is used, the current density is typically in the range of 1 to 40 ASF, and preferably 1 to 30 ASF. For example, when the electrolyte compositions of the present invention are used to deposit tin on connector strips in a high speed plating processes, a suitable current density is 10 to 60 ASD, resulting in a tin deposit having a thickness of typically from 1 to 15 microns. Plating time may range from about 5 minutes to 1 hour or more, depending on the difficulty of the work piece. See generally the examples which follow for exemplary preferred procedures.

The present invention is particularly suitable for depositing a solderable finish on an electronic device substrate. A wide variety of substrates may be plated with the compositions of the invention, as discussed above. Suitable substrates include, but are not limited to printed wiring boards, optoelectronic devices, semiconductor packages, microchip module packages, components, contacts, chip capacitors, chip resistors, lead frames, connectors, or integrated circuits. See the examples which follow for exemplary substrates plated in accordance with the invention.

All documents mentioned herein are fully incorporated herein by reference. The following non-limiting examples are illustrative of the invention.

EXAMPLE 1

Pure Tin

An electroplating composition of the invention was prepared by admixing the following components.

| | |
|---|---|
| Tin (as Stannous Methanesulphonate) | 40 g/L |
| Methanesulphonic Acid | 200 mL/L |
| Polyalkoxylate | 2 g/L |
| Ethylmaltol | 1 g/L |

An electrolyte bath was prepared by combining the electroplating composition with water to provide the desired volume. A printed circuit board substrate was plated by placing the substrate in the bath and treating the bath with a current density of 14.5 mA/cm$^2$ (waveform was DC; temperature plating bath was 35° C.). After plating, the substrate was removed and found to contain the desired tin deposit. It was observed that the electroplating composition plated effectively and had a semi-bright, uniform appearance. The electroplating composition also exhibited improved grain refinement and stability.

EXAMPLE 2

Tin-Silver; Low CD Range

The procedure of Example 1 was repeated except that the electroplating composition contained the following components. Similar high quality results were observed.

| | |
|---|---|
| Tin (as Stannous Methanesulphonate) | 20 g/L |
| Silver (as Silver Methanesulphonate) | 0.5 g/L |
| Thiourea | 3 g/L |

-continued

| | |
|---|---|
| Methanesulphonic Acid | 50 mL/L |
| Polyalkoxylate | 2 g/L |
| Ethylmaltol | 0.6 g/L |
| Maltol | 0.3 g/L |

EXAMPLE 3

Tin-Silver; High CD Range

The procedure of Example 1 was repeated except that the electroplating composition contained the following components. Similar high quality results were observed.

| | |
|---|---|
| Tin (as Stannous Methanesulphonate) | 50 g/L |
| Silver (as Silver Methanesulphonate) | 1.5 g/L |
| Thiourea | 6 g/L |
| Methanesulphonic Acid | 200 mL/L |
| Polyalkoxylate | 2 g/L |
| Ethylmaltol | 0.25 g/L |
| 3-Methyl-1,2-cyclopentanedione | 0.25 g/L |

EXAMPLE 4

Tin-Copper

The procedure of Example 1 was repeated except that the electroplating composition contained the following components. Similar high quality results were observed.

| | |
|---|---|
| Tin (as Stannous Methanesulphonate) | 60 g/L |
| Copper (as Copper Methanesulphonate) | 2 g/L |
| Methanesulphonic Acid | 200 mL/L |
| Polyalkoxylate | 4.5 g/L |
| Ethylmaltol | 1 g/L |

What is claimed is:

1. A method for depositing a solderable finish on an electronic device substrate, the method comprising: electrolytically depositing onto the substrate a metal from an electroplating composition that comprises one or more soluble metal salt, an electrolyte, at least one grain refiner/stabilizer additive comprising one or more hydroxylated gamma-pyrone compounds.

2. The method of claim 1 wherein the metal salt comprises tin.

3. The method of claim 1 wherein the grain refiner/stabilizer additive is present at concentrations of between about 2 mg and about 10,000 mg per liter of the electroplating composition.

4. The method of claim 1 wherein the stabilizer additive is present at concentrations of between about 50 mg and about 2000 mg per liter of the electroplating composition.

5. The method of claim 1 further comprising a brightener agent.

6. The method of claim 1 wherein the composition further comprises a suppressor agent.

7. The method of claim 1 wherein the composition further comprises a leveler agent.

8. The method of claim 1 wherein the substrate is a printed circuit board substrate or semiconductor with one or more microvias.

9. The method of claim 1 wherein the substrate is a microchip module substrate.

10. The method of claim 1 wherein the hydroxylated gamma-pyrone comprises Kojic acid, meconic acid, comenic acid, maltol, or ethylmaltol.

11. The method of claim 1 wherein the soluble metal salt comprises a salt of tin, zinc, copper, nickel, gold, silver, bismuth, indium or antimony.

12. The method of claim 1 wherein the metal is a tin alloy.

13. The method of claim 12 wherein the tin alloy of tin-silver or tin-copper.

14. The method of claim 1 wherein the metal is zinc alloy.

* * * * *